United States Patent [19]

Lipsky

[11] Patent Number: 4,573,212
[45] Date of Patent: Feb. 25, 1986

[54] INTEGRATED RECEIVER ANTENNA DEVICE

[75] Inventor: Stephen E. Lipsky, Rydal, Pa.

[73] Assignee: American Electronic Laboratories, Inc., Colmar, Pa.

[21] Appl. No.: 553,541

[22] Filed: Nov. 21, 1983

[51] Int. Cl.[4] .................. H04B 1/18; H04B 1/26; H01Q 1/36

[52] U.S. Cl. .................. 455/282; 343/701; 343/895; 455/293

[58] Field of Search .................. 455/280–282, 455/293; 343/701, 895

[56] References Cited

U.S. PATENT DOCUMENTS

| | | | |
|---|---|---|---|
| 2,832,885 | 4/1958 | Brett . | |
| 3,098,973 | 7/1963 | Wickersham, Jr. et al. | 343/701 |
| 3,246,245 | 4/1966 | Turner | 455/293 |
| 3,296,536 | 1/1967 | Copeland et al. . | |
| 3,509,465 | 4/1970 | Andre et al. | 455/282 |
| 4,214,316 | 7/1980 | Lipsky | 455/141 |
| 4,287,603 | 9/1981 | Moser | 455/293 |
| 4,319,248 | 3/1982 | Flam | 343/701 |

Primary Examiner—Marc E. Bookbinder
Attorney, Agent, or Firm—Jacob Trachtman

[57] ABSTRACT

An integrated receiver antenna device comprising a pair of antenna elements providing a spiral antenna for receiving radio frequency signals over a broadband of frequencies with an extended high frequency limit and providing high sensitivity over the broadband of frequencies. The elements each have first and second ends and provide a pair of interwound conductive windings with their first ends positioned proximate to each other at the center of the antenna for providing sensitivity at the high frequency limit of received radio frequency signal, while the second ends of the elements are displaced from the first ends and positioned at the periphery of the antenna. A detector mixer unit is connected between and positioned proximate to the first ends of the antenna elements for deriving radio frequency signals received by the antenna elements and receiving an input signal for providing an oscillating signal at the detector mixer unit for producing an output signal.

28 Claims, 10 Drawing Figures

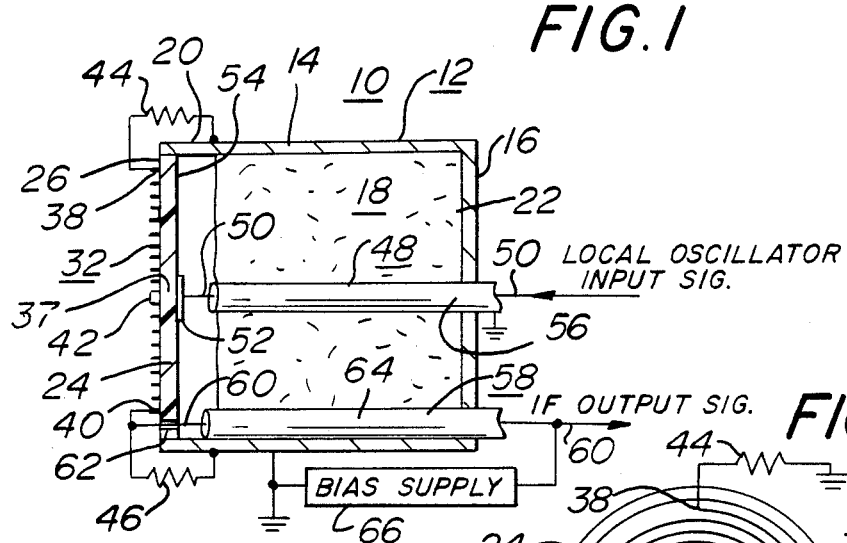
FIG.1
FIG.2
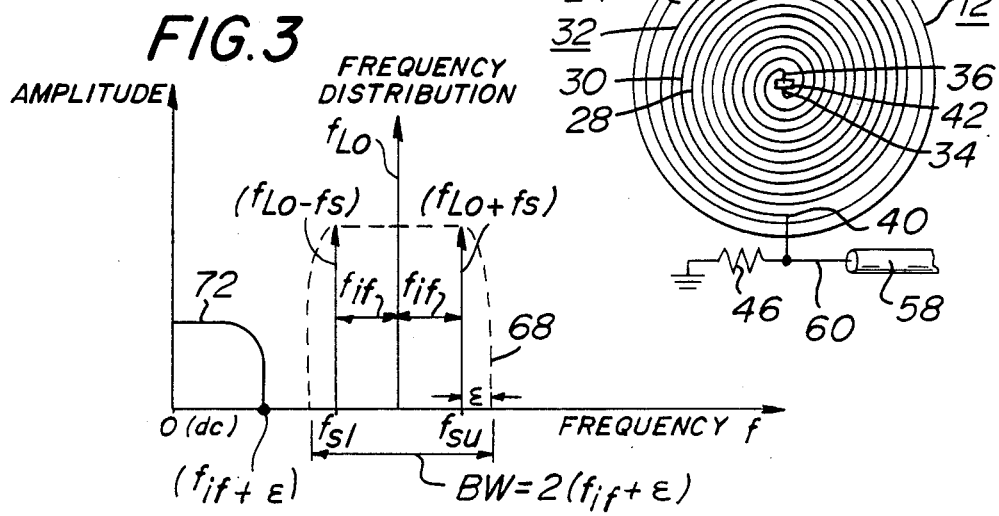
FIG.3
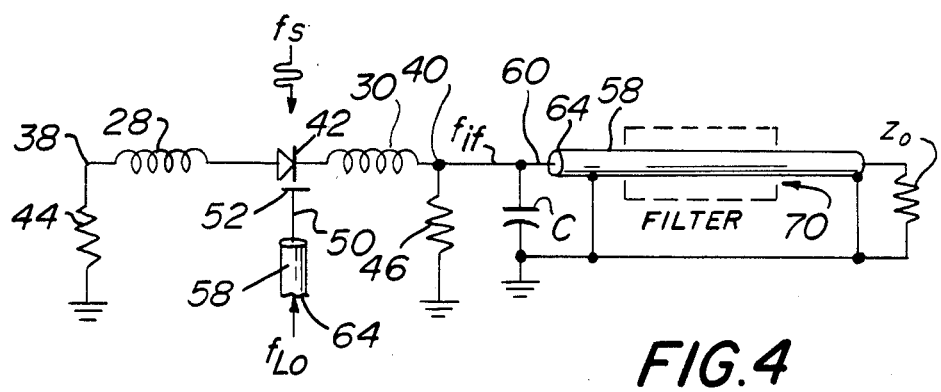
FIG.4

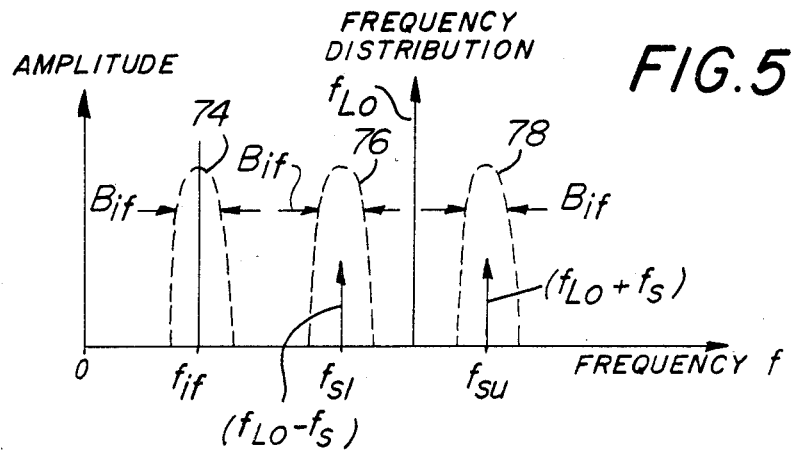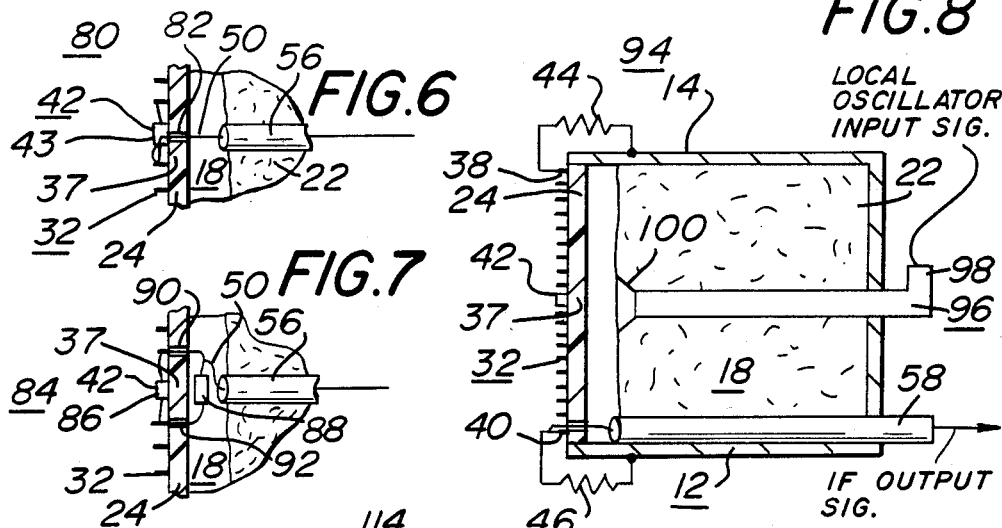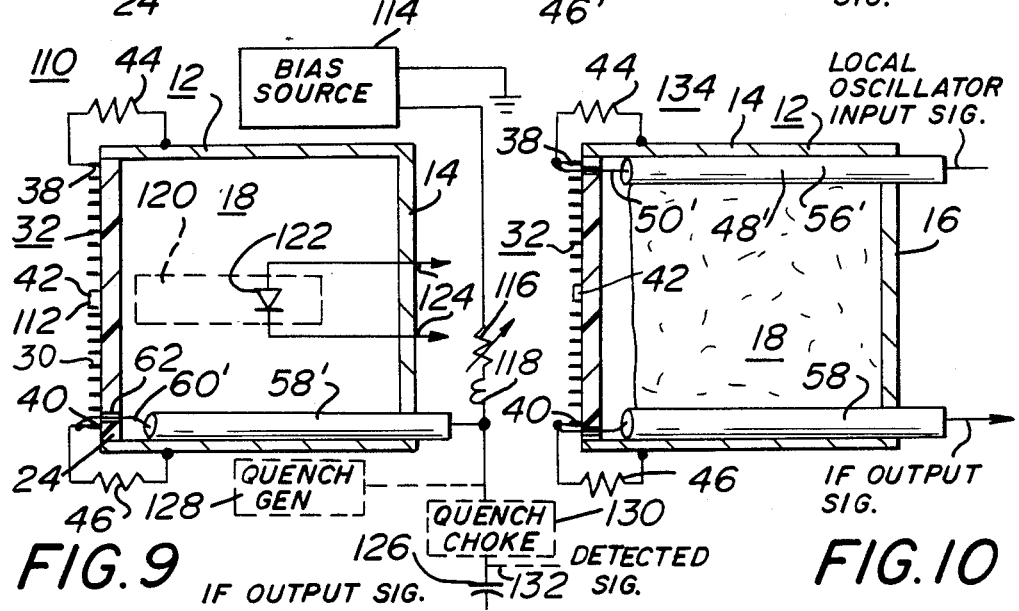

INTEGRATED RECEIVER ANTENNA DEVICE

The invention relates to an integrated receiver antenna device, and more particularly to an integrated receiver antenna device for receiving radio frequency signals over a broadband of frequencies and providing high sensitivity over the broadband of frequencies.

BACKGROUND OF INVENTION

The invention also relates to, but is not limited to, use in radar warning systems where a multiplicity of antennas are commonly grouped in a geographic distribution around an aircraft or other vessel to provide direction finding information by comparison of the amplitudes of the strongest to the next strongest received signal. Since a spiral type antenna can provide approximately 90° of spatial coverage, four such antennas are usually deployed at cardinal angle (90°) separations to cover 360° of azimuth simultaneously. In other systems, one or more spirals can be rotated mechanically or used to illuminate a passive fixed or rotating reflector to provide either signal detection from a single direction if fixed, or 360° of detection if scanned. In these and other types of applications, the bandwidth coverage of the antenna is extremely important. Modern technology can provide flat planar cavity backed spiral antennas capable of operating from 0.5 GHz to 22 GHz. The American Electronic Laboratories (AEL) Model AST 1500A is an example of such a device.

In the use of antennas of the type described above, a difficulty arises when millimeter wave reception, defined here as reception of signals greater than 20 GHz, is desired. It becomes necessary to feed the radio frequency (RF) signal from the antenna to the detecting or mixing means by the use of a waveguide type transmission line. It is necessary to minimize losses and to overcome propagation mode effects that exist in coaxial lines when operated at frequencies too high to permit realizable dimensions for the construction of the coaxial line. The use of coaxial lines at the frequencies of millimeter waves can add substantial signal loss as well.

An inherent bandwidth limitation also exists in the use of waveguides, since waveguides exhibit very high loss at frequencies approaching the low frequency cutoff ($\lambda_c$) of the guide and high attenuation and are subject to spurious mode effects of the dominant mode of propagation ($TE_{10}$ mode) at about 1.5 times the low frequency limitation (see Reference Data for Radio Engineers, Fifth Edition, Published by IT&T and H. W. Sams, page 23-8 and following). Typically in going from 18 GHz to 90 GHz, it will be necessary to use four types of waveguides, namely WR-42 from 18 to 26.5 GHz, WR-28 from 26.5 to 40 GHz, WR-19 from 40 to 60 GHz and WR-12 from 60 to 90 GHz, where the WR numbers refer to Electronic Industries Waveguide Designations. Therefore, even if an antenna could be designed to cover a wide range from 18 GHz to 90 GHz for example, the method of transmitting such signals would be extremely complex if not impossible using all of the required waveguides. Although attempts have been made to overcome this problem by the use of ridged waveguides, ridged guides however, have the disadvantage of providing increased attenuation which is counter to the objective of obtaining maximum sensitivity by reducing losses in the transmission system between the antenna and detecting means.

A first solution to this problem has been recognized by Richard P. Flam in his U.S. Pat. No. 4,319,248 entitled Integrated Spiral Antenna-Detector Device, in which a detector diode is placed at the center feed points of a spiral antenna, with the detected signals removed from the antenna at the outer periphery. This embodiment effectively eliminates the transmission line, permitting direct video detection of all signals received by the spiral antenna. The spiral antenna elements are mounted in front of a cavity which is lined with RF anechoic material, for the purpose of completely absorbing the back radiating wave and providing wideband coverage at the penalty of 3 db of antenna gain. A commercial version of this antenna is offered for sale by American Electronic Laboratories, Inc. under the trademark ANTECTOR (Catalog 7827.5M, page 3a). The prior art devices, however, do not provide the high sensitivity over a broad-band attained by the present invention utilizing superheterodyne or superregenerative detection by an integrated receiver antenna device having a detector mixer unit at the center feed points of a spiral antenna.

SUMMARY OF THE INVENTION

It is therefore a principal object of the invention to provide a new and improved integrated receiver antenna device providing high sensitivity to received radio frequency signals.

Another object of the invention is to provide a new and improved integrated receiver antenna device which provides high sensitivity to radio frequency signals over an extended range of high frequencies and a detected output signal.

Another object of the invention is to provide a new and improved integrated receiver antenna device which has a broad frequency range with greatly extended upper frequency limit for sensed radio frequency signals.

Another object of the invention is to provide a new and improved integrated receiver antenna device which permits superheterodyne or superregenerative detection of received radio frequency signals.

Another object of the invention is to provide a new and improved integrated receiver antenna device providing a cavity backed spiral antenna which is highly sensitive to a broad frequency range with an extended high frequency limit and has a compact and highly functional configuration.

Another object of the invention is to provide a new and improved integrated receiver antenna device which is simple in construction and highly effective in operation.

The above objects as well as many other objects and advantages of the invention are achieved by an integrated receiver antenna device comprising a pair of antenna elements providing a spiral antenna for receiving radio frequency signals over a broadband of frequencies with an extended high frequency limit. The elements each have first and second ends and provide a pair of interwound conductive windings with their first ends positioned proximate to each other at the center of the antenna for providing sensitivity at the high frequency limit of received radio frequency signals. The second ends of the elements are displaced from the first ends and positioned at the periphery of the antenna. A detector mixer unit is connected between and positioned proximate to the first ends of the antenna elements for deriving radio frequency signals received by the antenna elements. Signal input means supplies an input signal for providing an oscillating signal at the detector mixer unit for producing an output signal. A signal output means is connected to the antenna elements at a location substantially displaced from the detector mixer unit for receiving the output signal.

When the input signal provided by the input means to the detector mixer unit is a local oscillator signal, an intermediate frequency (IF) signal is produced and delivered as the output signal from locations at or proximate to the second ends of the antenna elements. The signal output means also delivers a biasing signal to the detector mixer unit through the antenna elements for establishing the operating conditions for the mixer detector unit. In the case where the device operates as an oscillating detector, the mixer detector unit may be a negative resistance or tunnel diode which is biased to oscillate at a desired or controlled frequency to provide the intermediate frequency output signal. When operating in the superregenerative mode a quench signal may also be provided by the output means to the detector mixer unit for periodically quenching the oscillations and providing a detected output signal.

The invention by using the integrated receiver antenna device in conjunction with a local oscillator provides a superheterodyne receiver capable of down-converting large portions of the RF high frequencies spectrum to lower, more usable portions of the RF spectrum. Such mixing methods and local oscillator coupling methods take place at the mixer detector unit mounted at the center feed points of the spiral antenna. Both fixed tuned and variable tuned local oscillators are used to provide both wide-band down-conversion as well as narrow-band tuned conversion. The narrow-band width is obtained by the use of an intermediate frequency filter/amplifier, operative at the sum or difference frequencies ($f_s \pm f_o$) between the incoming signal $f_s$ and the local oscillator frequency $f_{Lo}$. Regenerative or superregenerative modes of operation can be used as described above for achieving higher sensitivities and more definitive frequency coverage than that obtained by the simple video detector means of the U.S. Pat. No. 4,319,248.

In another mode of operation, the mixer detector unit may comprise a beam lead diode in parallel with a step recovery diode. The step recovery diode oscillates at frequencies to generate a comb of frequencies (tines) which are multiples of the frequency of the local oscillator input signal for providing broad wide-band frequency coverage. The frequency of the local oscillator may also be varied so that the frequencies generated by the step recovery diode sweep between the lowest and highest frequencies to provide full wide-band coverage and produce corresponding intermediate frequency signals. This arrangement permits detection of derived radio frequency signals on either side of each tine of the comb of frequencies and the delivery of a dc to video output signal at the periphery of the antenna. This constitutes a homodyne detection process having a signal bandwidth extending to two times the video bandwidth multiplied by the number of tines of the generated comb. For greater detail reference is made to my U.S. Pat. No. 4,214,316 issued July 22, 1980 relating to a method and apparatus for synchronuously tuning the multi-channel superheterodyne receiver of a system. When the output signal of the detector mixer unit is an intermediate frequency signal, both the desired real signal and the image signal bandwidths are scanned, thereby improving the intercept and detection probability of radio frequency signals received by the integrated receiver antenna device.

BRIEF DESCRIPTION OF THE DRAWING

The foregoing and other objects of the invention will become more apparent when the following detailed description of the invention is read in conjunction with the drawing, in which:

FIG. 1 is a sectional view of a cavity backed planar spiral integrated receiver antenna device partly in schematic form illustrating an embodiment of the invention, FIG. 2 is a left end view of the integrated receiver antenna device of FIG. 1, FIG. 3 is a graphical illustration of the frequency distribution of the signals produced by the integrated receiver antenna device of FIG. 1, FIG. 4 is a schematic illustration of the integrated receiver antenna device of FIG. 1 including a bandpass filter for the output signal, FIG. 5 is a graphic illustration of the bandpass signals derived from the device illustrated in FIG. 4, FIG. 6 is a fragmentary sectional view of an integrated receiver antenna device showing a modified form of the receiver antenna device of FIG. 1, FIG. 7 is a fragmentary sectional view of an integrated receiver antenna device illustrating another modified form of the device shown in FIG. 1, FIG. 8 is a sectional view of another form of an integrated receiver antenna device of the invention utilizing a waveguide, FIG. 9 is a sectional view of an integrated receiver antenna device illustrating a further modified form of the invention, and FIG. 10 is a sectional view of an integrated receiver antenna device illustrating another modified form of the invention.

Like reference numerals designate like parts through the several views.

DETAILED DESCRIPTION OF THE INVENTION

FIGS. 1 and 2 disclose an integrated antenna receiver device 10 embodying the invention. The device 10 comprises a cavity backed planar spiral antenna having a body 12 of cylindrical form with a cylindrical conductive side wall portion 14 of metal having one end enclosed by a conductive plane end wall portion 16 of metal forming a cavity 18 therewithin. The other end 20 of the body 12 provides an opening to the cavity 18. The cavity 18 may be filled with anechoic material 22, typically carbonized foam such as Emerson Cummings LS or equivalent, for absorbing the radio frequency energy of the back wave. A non conductive plate 24 which is made of an electrically insulating material is received over the opening at the end 20 of the body 12 enclosing the cavity 18. The outer surface 26 of the plate 24 supports thereon a pair of interwound spiral elements 28, 30 of conductive material forming a spiral planar antenna 32 for receiving radio frequency (RF) signals. The antenna element 28, 30 have closely spaced inner ends 34, 36 at the center region 37 of the plate 24, and opposite diametrically displaced outer ends 38, 40 positioned at the periphery of the antenna 32. The interwound conductive antenna elements 28, 30 may be provided by electro deposition of conductive material on the plate 24 or by other processes well known to the art. A detector mixer unit 42 which may comprise a beam lead or other diode of small dimensions is positioned between and has its leads respectively connected to the inner ends 34, 36 of the antenna elements 28, 30 at the center region 37 of the plate 24. A terminating means connects each of the outer ends 38, 40 of the antenna elements 28, 30 to ground potential or a conductive portion of the body 12 which is also at ground potential, through respctive resistors 44, 46 which provide the desired terminations for the antenna 32.

A signal input means of the integrated receiver antenna device 10 comprising a coaxial cable 48 extends centrally in the axial direction through the end wall portion 16 into the cavity 18 of the body 12. The center conductor 50 of the coaxial cable 48 electrically contacts a small thin conductive region 52 on the inner surface 54 of the plate 24 at the central region 37 opposite to the inner ends 34, 36 of the antenna elements 28, 30 and the detector mixer unit 42. The conductor region 52 may be a thin plated surface provided by electro deposition or by other means known to the art. The outer cylindrical conductor 56 of the coaxial cable 48 is returned to ground potential or to the conductive body 12.

An input signal which may be from a local oscillator is delivered by the cable 48 to the conductive region 52 on the inner surface of the plate 24. A signal output means of the device 10 provided by a second coaxial cable 58 also extends in the axial direction through the end wall portion 16 into the cavity 18 of the body 12 proximately along the side wall portion 14. The center conductor 60 of the cable 58 at its inner end extends through an opening 62 in the plate 24 close to its periphery, and connects with the end 40 of the antenna element 30 at its junction with the resistor 46. The outer conductor 64 of the coaxial cable 58 is connected to ground potential or to the conductive body 12. When required, a bias supply 66 is connected between ground potential and the center conductor 60 of the coaxial cable 58 outside of the body 12 for delivering a bias signal to the detector mixer unit 42 through the antenna element 30 which connects to one side of the unit 42 and the antenna element 28 which connects the other side of the unit 42 and returns to ground potential through the resistor 44.

Although coaxial type cables are illustrated for signal transmission in the device 10, a waveguide can be used to provide a local oscillator signal to the detector mixer unit 42 as will be described below in connection with FIG. 8. Means other than the plated conducting surface 52 on the plate 24 for providing an oscillating signal at the unit 42 can be utilized as will also be illustrated.

In the operation of the receiver antenna device 10 a required bias signal is provided to the detector mixer unit 42 for establishing its operating conditions. The signal input means delivers a local oscillator signal to the detector mixer unit 42 by using the capacitor effect. This effect is provided by the small region 52 acting as one plate of a parallel plate capacitor with the other plate comprising the unit 42 and the associated inner ends 36, 38 of the elements 28, 38 which are separated by the dielectric of the insulating material of the plate 24 therebetween. In this manner, the local oscillator signal is effectively coupled to the detector mixer unit 42 which when also excited by the radio frequency signal picked up by the spiral antenna 32 causes the mixing action which is well known to take place. This results in the unit 42 producing an intermediate frequency (IF) output signal. The frequencies $f_{if}$ of the intermediate frequency output signal which are produced by simple mixing action are given by $$f_{if} = f_s \pm f_{Lo} + \text{other terms},$$

where $f_s$ is the radio frequency signal received or picked up by the spiral antenna 32, and $f_{Lo}$ is the frequency of the local oscillator signal applied to the detector mixer unit 42 by the coaxial cable 48 of the signal input means. The output signal is delivered by the device 10 over the coaxial cable 58. In this case, the detector mixer unit 42 produces an intermediate frequency output signal by operating in the superheterodyne mode which is described below in greater detail in connection with FIG. 3.

FIG. 3 graphically illustrates the amplitude versus frequency distribution of the local oscillator input signal and the signal products produced by mixing with the radio frequency signal picked up by the antenna 32. The local oscillator signal of frequency $f_{Lo}$ delivered by the coaxial cable 48 is shown to have the greatest amplitude. The two signal products of the mixing operation which are shown to have frequencies $f_{sl}$ and $f_{su}$, commonly referred to as the real signal ($f_{Lo} - f_s$) and image signal ($f_{Lo} + f_s$), are represented as having smaller amplitudes. The dotted line envelope 68 includes the bandwidth BW of frequencies produced by the mixing action comprising the real and image signals which are shown with frequencies $f_{sl}$ and $f_{su}$ on the lower and upper sides of the local oscillator frequency $f_{Lo}$. The bandwidth of the intermediate frequency signal is limited at its low frequency end by dc and at its high frequency end by the natural filtering resulting from the inductance of the antenna elements 28, 30 and the shunt capacitance represented by the transmission cable 48. From FIG. 3, it is also seen that the integrated receiver antenna device 10 permits a maximum bandwidth BW of $2f_{if} + 2\epsilon$ to be instaneously received, and the curve 72 of FIG. 3 shows the case where the intermediate frequency (IF) signal extends from dc or zero frequency difference to the maximum value ($f_{if} + \epsilon$). The delivery of such output signals by the integrated receiver antenna device is commonly known as homodyne detection.

Standard bandpass detection result when a bandpass filter is connected in series with the cable 58, or capacitance is present between the conductor 60 of the coaxial cable 58 at the junction point 40 of the antenna device 10 and ground potential. FIG. 4 illustrates the low pass limitation of the receiver antenna device 10 resulting from the inductance of the spiral elements 28, 32 and the capacitance C which may be either the stray capacitance and capacitance of the coaxial cable 58 or may be purposely supplied by a fixed capacitor, depending upon specific requirements, which act to effectively provide a bandpass filter. The coaxial cable 58 may be terminated in its characteristic impedance $Z_o$ which, if resistive, limits the intermediate frequency signal response to that achieved by the stray capacitance C. The coaxial cable 58 can also be reactively terminated by an impedance $Z_o$ equal to the sum of the resistive and reactive components ($Z_o = R \pm jx$) for the purpose of placing a specific upper frequency limit on the output signal. It is recognized that a series connected low or bandpass type filter 70 shown by the dashed lines 70 in FIG. 4 may be added to further process the output signals of the coaxial cable 58.

FIG. 5 illustrates the frequency distribution of signals obtained where a standard bypass filter is used. The frequency bandpass $B_{if}$ of the filter shown by the dashed line envelope 74 is transposed to the bandpass $B_{if}$ about the real signal frequency $f_{sl}$ and the bandpass $B_{if}$ about the image frequency $f_{su}$ which bandpasses are represented respectively by the dashed line envelopes 76 and 78. The frequency $f_{sl}$ within the envelope 76 corresponds to the difference of frequencies between the local oscillator signal frequency $f_{Lo}$ and the received signal frequency $f_s$, while the envelope 78 about the frequency $f_{su}$ corresponds to the sum of the frequencies of these signals. The bandpass filter, thus, may select signals from either the real or the image signal bands as desired.

FIG. 6 illustrates a portion of an integrated antenna device 80 which is a modification of the device 10 shown in FIGS. 1 and 2. Since the device 80 is substantially similar to that of the device 10, only differences in structure and operation will be described in detail. The coaxial cable 56 which extends into the cavity 18 of the body 12 has its center conductor 50 which passes through an opening 82 in the plate 24 at its center region 37 connected directly to one of the two leads of a diode 43 comprising the detector mixer unit 42. The input signal which may be a local oscillator signal is directly delivered at one end of the cable 56 to the detector mixer unit 42 for producing the sum and difference product signals comprising the intermediate frequency output signal resulting from the mixing operation with the radio frequency signal $f_s$ derived from the antenna elements 28, 30. The device 80, thus, operates in a manner similar to that of the device 10 except that it provides the mixing signal directly to the diode 43 which may be a beam lead diode, instead of providing the local signal by the capacitor effect utilized by the embodiment of FIG. 1.

In another form, receiver antenna device 84 shown in FIG. 7 which differs from the device 80 of FIG. 6, utilizes a detector mixer unit 42 with a beam lead diode 86 connected in parallel with a step recovery diode 88. The step recovery diode 88 is positioned within the chamber 18 of the body 12 at the central region 37 of the plate 24 opposite to the diode 86 and has its pair of leads connected to the leads of the diode 86 by passing through respective openings 90, 92 of the dielectric material of plate 24. The center conductor 50 of the coaxial cable 56 is connected to the leads of the diodes 86 and 88 on one side to provide the local oscillator signal to the detector mixer unit 42. The openings 90, 92 may also be plated through connections and the detector mixer unit 42 may be excited by utilizing a waveguide rather than the coaxial cable 56 as illustrated and considered in greater detail in connection with FIG. 8.

In operation, the step recovery diode 88 generates a comb or plurality of signals at frequencies which are multiples of the excitation frequency of the local oscillator, so that mixing action takes place at the local oscillator frequency and each of the signal frequencies generated by the step recovery diode 88. This results in a plurality of intermediate frequency signals produced by the superheterodyne mixing action with the picked up (RF) signal. By varying the excitation frequency, each tine of the comb of frequencies generated by the diode 88 sweeps a frequency band corresponding to the amount of the change and the change can be set to produce a sweep which is exactly necessary for continuous coverage of the desired radio frequency range. It is therefore only necessary to vary the excitation frequency by amount of the frequency separation of the comb tines, rather than having to sweep the local oscillator over the entire range. The range of frequencies scanned, thus, may be continuous over a band extending from the lowest to the highest frequency of the output signal produced by the mixing action.

FIG. 8 illustrates a receiver antenna device 94 which is a modified form of the device 10 illustrated in FIGS. 1 and 2. The device 94 differs from the device 10 by utilizing a waveguide 96 as its signal input means in place of the coaxial cable 48. The end 98 which extends out of the cavity 18 of the body 12 receives a local oscillator input signal which is transmitted to its end 100 which is positioned proximate to the center region 37 of the plate 24 for irradiating its inner surface with the local signal. The local signal is thus transmitted to the detector mixer unit 42 and with the incoming signal received by the spiral antenna 32 produces the intermediate frequency output signal which is delivered externally by the cable 58 of the output signal means. As in the case of the device 10, the cable 58 may provide the required biasing signal to the diode of the detector mixer unit 42 for providing the desired operating conditions.

The receiver antenna device 110 of FIG. 9 is a modified form of the device 10, in which the signal input and output means are provided by a single coaxial cable 58'. The center conductor 60' of the coaxial cable 58' extends through the opening 62 of the plate 24 and is directly connected to the outer end 40 of the antenna element 30 of the spiral antenna 32. The detector mixer unit 42 comprises a tunnel or negative resistance diode 112 which receives a bias signal from the bias source 114. The bias source is connected between ground potential and the center conductor 60' of the cable 58' through a series connected resistor 116 which may be variable to adjust the amplitude of the bias signal and a choke coil 118 which minimizes the transmission therethrough of the output signal which is delivered externally by the cable 58'. The bias signal which is provided to the diode 112 by the cable 58' through the windings of the spiral antenna 32 is selected to cause the tunnel diode 112 to exhibit negative resistance properties and to oscillate. The diode 112 oscillates in resonance with the inductance of the spiral elements of the antenna 32 and acts as an oscillating converter.

A short length of cylindrical guide 120 shown by dashed lines within the cavity 18 of the body 12 can also be mounted behind the plate 24 in the manner illustrated in FIG. 9 to form a resonant chamber when desired to enhance the oscillators produced by the diode 112. The resonance of the chamber 120 can be varied by changing its length which need not necessarily extend outside of the cavity 18, but could do so if required. The resonance frequency of the cavity 18 or of the chamber 120 can be varied by the capacitance provided by a varactor device or diode 122. The diode 122 may be connected by conductors 124 to an external voltage source which may be variable for controlling its capacitance. The adjustment of the voltage to the conductors 124 in concert with that supplied by the bias source 114 to the diode 112 may be utilized for tuning the oscillating frequency produced by the diode 112. The mixing action of the diode 112 provides the intermediate frequency signal which is delivered by the cable 58' of the input and output means through a series capacitor 126 which isolates the output signal from the voltage signal of the bias source.

The above described embodiment of the receiver antenna device 10 may be modified by the addition of a quench signal generator 128 shown by the dashed lines of FIG. 9 for providing a quench signal to the diode 112 of the detector mixer unit 42 through the cable 58'. The addition of the quench signal to the biasing signal from the source 114 acts to periodically interrupt the oscillations produced by the diode 112 and then allows the oscillations of the diode 112 to build up resulting in superregenerative detection. The detected signal from the detector mixer device 42 is delivered by the coaxial cable 58' through a quench choke 130 which may comprise a series choke bypassed by a capacitor for delivering the detected signal over the output line 132 shown by the dashed lines. The quench choke 130 acts to isolate the quench signal from the detected signal since the detected signal is typically a modulated signal having a frequency below the frequency of the quench signal.

The receiver antenna device 134 illustrated in FIG. 10 is a modified form of the device 10 of FIG. 1 in which the signal input means is provided by a coaxial cable 48' which extends axially through the end wall portion 16 of the body 12 into the cavity 18 along the cylindrical portion 14 and opposite to the cable 58 of the signal output means. The center conductor 50' of the cable 48' is connected to the outer end 38 of the antenna element 28 of the spiral antenna 32, while its outer conductor 56' is returned to the conductive portion of the body 12 or to ground potential. In this embodiment, the input signal of the device 134 which may be a local oscillator signal, is delivered by the coaxial cable 48' to the outer end 38 of the antenna 32 and through its elements 28, 30 to the detector mixer unit 42 which may be a beam lead diode or other appropriate means for providing intermediate frequency or detected output signals of the device 134. As previously described, the cable 58 of the signal output means may also transmit a bias signal to the detector mixer unit 42 and deliver the intermediate frequency or detected output signal. The arrangement of the signal input and output means of the device 134 provides a balance structure without disturbing the signal absorbing material 22 which is positioned behind the center region 37 of the plate 24. Appropriate dc blocking is also achieved for the intermediate frequency signal and local oscillator signal feed points of the device as described above. This arrangement of the cables 48' and 58 for providing input signals and deriving output signals, may be utilized to provide superheterodyne detection producing intermediate frequencies and also as a superregenerative detector. When used as a superregenerative detector as described in connection with the embodiment of device 110 of FIG. 9, the detector mixer unit 42 may comprise a negative resistance or tunnel diode and a quench generator can be provided with means to separate the quench frequency from the detected video signal delivered by the output means.

While several embodiments have been described in detail, additional modifications and variations of the disclosed integrated receiver antenna device will be readily apparent to those skilled in the art, and the invention may find wide application with appropriate modification to meet the particular design circumstances, but without substantially departing from the essence of the invention.

What is claimed is:

1. An integrated receiver antenna device comprising a pair of antenna elements providing a spiral antenna for receiving radio frequency signals over a broadband of frequencies with an extended high frequency limit, the elements each having first and second ends and providing a pair of interwound conductive windings with their first ends positioned proximate to each other at the center of the antenna for providing sensitivity at the high frequency limit of received radio frequency signals and having their second ends displaced from the first ends and positioned at the periphery of the antenna, a flat plate of non conductive material supporting on a flat surface thereof the conductive windings of the spiral antenna, a supporting body having a conductive wall with an opening providing a cavity therein, and in which the plate is supported over the opening of the body for enclosing its cavity, a detector mixer unit connected between and positioned proximate to the first ends of the antenna elements for deriving radio frequency signals received by the antenna elements, signal input means for supplying an input signal providing an oscillating signal at the detector mixer unit for producing an output signal by the detector mixer unit which is an intermediate frequency signal, and signal output means connected to the antenna elements at a location substantially displaced from the detector mixer unit for delivering the output signal from locations proximate to the second ends of the antenna elements, and in which the signal input means includes a signal conducting means having a first signal conductor providing the input signal to the detector mixer unit and a second conductor which is returned to the conductive wall of the body, and the signal output means includes signal conducting means having a first conductor connecting with one of the second ends of the pair of windings of the antenna and a second conductor returned to the conductive wall of the body and first and second signal terminating means respectively returning the second ends of the antenna elements to the conductive wall of the body, and the signal output means delivers a biasing signal to the detector mixer unit through the antenna elements.

2. The device of claim 1 in which the detector mixer unit is a diode.

3. The device of claim 2 in which the signal output means includes a voltage supply means for providing the biasing signal to the antenna elements for delivery to the detector mixer unit, and in which the detector mixer unit is a beam lead diode, and the signal output means is connected to the second ends of the antenna elements for delivering output signals from the antenna elements.

4. The device of claim 1 in which the signal conducting means of the signal input means is a coaxial transmission line extending into the cavity of the body having a center conductor providing the input signal to one of the second ends of the windings and an outer conductor which is returned to the conductive wall of the body, and the signal conducting means of the signal output means is a coaxial transmission line having a center conductor connected to the other second end of the windings and an outer conductor which is returned to the conductive wall of the body, and the first and second terminating means comprise a pair of resistor elements respectively connecting the second ends of the antenna elements to the conducting wall of the body.

5. The device of claim 4 in which the signal output means delivers a biasing signal to the detector mixer unit through the windings of the antenna.

6. The device of claim 5 which includes a voltage supply means for providing the biasing signal to the antenna elements for delivery to the detector mixer unit, and in which the detector mixer unit is a beam lead diode, and the signal output means is connected to the second ends of the antenna elements for delivering output signals from the antenna elements.

7. An integrated receiver antenna device comprising a pair of antenna elements providing a spiral antenna for receiving radio frequency signals over a broadband of frequencies with an extended high frequency limit, the elements each having first and second ends and providing a pair of interwound conductive windings with their first ends positioned proximate to each other at the center of the antenna for providing sensitivity at the high frequency limit of received radio frequency signals and having their second ends displaced from the first ends and positioned at the periphery of the antenna, a flat plate of non conductive material supporting on a flat surface thereof the conductive windings of the spiral antenna, a supporting body having a conductive wall with an opening providing a cavity therein, and in which the plate is supported over the opening of the body for enclosing its cavity, a detector mixer unit connected between and positioned proximate to the first ends of the antenna elements for deriving radio frequency signals received by the antenna elements, signal input means for supplying an input signal providing an oscillating signal at the detector mixer unit for producing an output signal which is an intermediate frequency signal, and signal output means connected to the antenna elements at a location substantially displaced from the detector mixer unit for receiving the output signal from locations proximate to the second ends of the antenna elements, and in which the signal input means includes a signal conducting means having a first signal conductor providing the input signal to the detector mixer unit and a second conductor which is returned to the conductive wall of the body, and the signal output means includes signal conducting means having a first conductor connecting with one of the second ends of the pair of windings of the antenna and a second conductor returned to the conductive wall of the body and first and second signal terminating means respectively returning the second ends of the antenna elements to the conductive wall of the body, and the signal output means delivers a biasing signal to the detector mixing unit through the windings of the antenna.

8. The device of claim 7 in which the signal conducting means of the signal input means is a coaxial transmission line having a center conductor for providing the input signal to the detector mixer unit and an outer conductor which is returned to the conductive wall of the body, the signal output means is a coaxial transmission line having a center conductor connected to the second end of one of the antenna elements and an outer conductor returned to the conductive wall of the body, and the first and second terminating means comprise a pair of resistor elements respectively connecting the second ends of the antenna elements to the conductive wall of the body.

9. The device of claim 8 which includes a voltage supply means for providing the biasing signal to the antenna elements for delivery to the detector mixer unit, and in which the detector mixer unit is a beam lead diode, and the signal output means is connected to the second ends of the antenna elements for delivering output signals from the antenna elements.

10. The device of claim 8 in which the windings of the antenna and the detector mixer unit are positioned on the external surface of the plate enclosing the cavity of the body, the plate on its internal surface has a conductive area opposite to the first ends of the windings and the detector mixer unit, the coaxial transmission line of the signal input means and the coaxial transmission line of the signal output means extend into the cavity of the body through its wall, the center wire of the signal input means connects with the conductive area of the plate for providing the input signal to the detector mixer unit, and the center conductor of the signal output means extends through the plate to connect with the one of the second ends of the windings of the antenna.

11. The device of claim 8 in which the coaxial transmission line of the signal input means and the coaxial transmission line of the signal output means extend into the cavity of the body through its wall, the center wire of the signal input means is connected to one side of the detector mixer unit to provide the input signal, and the center conductor of the signal output means connects with the one of the second ends of the antenna elements.

12. The device of claim 11 in which the windings of the antenna are positioned on the external surface of the plate enclosing the cavity of the body, the center wire of the signal input means is joined directly by a connection extending through the plate to one side of the detector mixer unit to provide the input signal to the detector mixer unit, and the center conductor of the signal output means extends through the plate to connect with the one of the second ends of the antenna elements.

13. The device of claim 12 which includes a voltage supply means for providing the biasing signal to the output means for delivery through the antenna elements to the detector mixer unit, and in which the detector mixer unit is a beam lead diode, and the signal output means is connected to the second ends of the antenna elements for delivering output signals from the antenna elements.

14. The device of claim 11 in which the detector mixer unit comprises a plurality of parallel connected diodes at least one of which is a step recovery diode for producing a plurality of superimposed intermediate frequency signals for providing the output signal.

15. The device of claim 14 which includes a voltage supply means for providing the biasing signal to the antenna elements for delivery to the detector mixer unit, and in which the detector mixer unit includes a beam lead diode, and the signal output means is connected to the second ends of the antenna elements for delivering output signals from the antenna elements.

16. An integrated receiver antenna device comprising a pair of antenna elements providing a spiral antenna for receiving radio frequency signals over a broadband of frequencies with an extended high frequency limit, the elements each having first and second ends and providing a pair of interwound conductive windings with their first ends positioned proximate to each other at the center of the antenna for providing sensitivity at the high frequency limit of received radio frequency signals and having their second ends displaced from the first ends and positioned at the periphery of the antenna, a flat plate of non conductive material supporting on a flat surface thereof the conductive windings of the spiral antenna, a supporting body having a conductive wall with an opening providing a cavity therein, and in which the plate is supported over the opening of the body for enclosing its cavity with the windings of the antenna and the detector mixer unit on the external surface of the plate, a detector mixer unit connected between and positioned proximate to the first ends of the antenna elements for deriving radio frequency signals received by the antenna elements, signal input means for supplying an input signal providing an oscillating signal at the detector mixer unit for producing an output signal which is an intermediate frequency signal, and signal output means connected to the antenna elements at a location substantially displaced from the detector mixer unit for receiving the output signal from locations proximate to the second ends of the antenna elements, and in which the signal conducting means of the signal input means is a wave guide extending into the cavity of the body having a signal radiating end proximate to the internal surface of the plate opposite the first ends of the windings and the detector mixer unit for providing the input signal to the detector mixer unit, and the signal output means is a coaxial transmission line having a center conductor connected to one of the second ends of the antenna elements and an outer conductor returned to the conductive wall of the body and includes terminating means comprising a pair of resistor elements respectively connecting the second ends of the antenna elements to the conducting wall of the body.

17. The device of claim 16 in which the signal output means delivers a biasing signal to the detector mixer unit through the windings of the antenna.

18. The device of claim 17 which includes a voltage supply means for providing the biasing signal to the antenna elements for delivery to the detector mixer unit, and in which the detector mixer unit is a beam lead diode, and the signal output means is connected to the second ends of the antenna elements for delivering detected output signals from the antenna elements.

19. An integrated receiver antenna device comprising a pair of antenna elements providing a spiral antenna for receiving radio frequency signals over a broadband of frequencies with an extended high frequency limit, the elements each having first and second ends and providing a pair of interwound conductive windings with their first ends positioned proximate to each other at the center of the antenna for providing sensitivity at the high frequency limit of received radio frequency signals and having their second ends displaced from the first ends and positioned at the periphery of the antenna, a flat plate of non conductive material supporting on a flat surface thereof the conductive windings of the spiral antenna, a supporting body having a conductive wall with an opening providing a cavity therein, and in which the plate is supported over the opening of the body for enclosing its cavity, a detector mixer unit connected between and positioned proximate to the first ends of the antenna elements for deriving radio frequency signals received by the antenna elements, signal input means for supplying an input signal providing an oscillating signal at the detector mixer unit for producing an output signal which is an intermediate frequency signal, and signal output means connected to the antenna elements at a location substantially displaced from the detector mixer unit for receiving the output signal from locations proximate to the second ends of the antenna elements, and in which the detector mixer unit is an oscillating signal generating diode, and the signal input and output means are provided by a signal conducting means for supplying the input signal and receiving the output signal having first and second conductors which extend into the cavity of the body and first and second signal terminating means respectively returning the second ends of the antenna elements to the conductive wall, the first conductor of the conducting means is connected with one of the second ends of the pair of windings and the second conductor is returned to the conductive wall of the body, and the conducting means delivers the input signal to the diode for causing the diode to generate an oscillating signal and to produce the intermediate frequency signal.

20. The device of claim 19 in which the signal conducting mean is a coaxial transmission line having a center conductor connecting with one of the second ends of the pair of windings of the antenna, and an outer conductor which is returned to the conductive wall of the body and the first and second signal terminating means comprise a pair of resistors respectively returning the second ends of the antenna elements to the conductive wall of the body.

21. The device of claim 20 in which the windings of the antenna and the detector mixer unit are on the external surface of the plate enclosing the cavity of the body, and the signal input and output means deliver a biasing signal to the diode of the detector mixer unit through the windings of the antenna for causing the diode to produce the oscillating signal.

22. The device of claim 21 which includes a voltage supply means for providing the biasing signal to the signal conducting means for delivery through the antenna elements to the oscillating signal generating diode, and in which the oscillating signal generating diode is a negative resistance diode.

23. The device of claim 22 in which a resonant cavity means is provided within the cavity of the body proximate to the detector mixer device, and a capacitor device which provides a controlled variable capacitance is received within the resonant cavity means for adjusting the frequency of the oscillating signal generated by the diode of the detector mixer unit.

24. An integrated receiver antenna device comprising a pair of antenna elements providing a spiral antenna for receiving radio frequency signals over a broadband of frequencies with an extended high frequency limit, the elements each having first and second ends and providing a pair of interwound conductive windings with their first ends positioned proximate to each other at the center of the antenna for providing sensitivity at the high frequency limit of received radio frequency signals and having their second ends displaced from the first ends and positioned at the periphery of the antenna, a flat plate of a non conducting material supporting on a flat surface thereof the conductive windings of the spiral antenna, a supporting body having a conductive wall with an opening providing a cavity therein, the plate is supported over the opening of the body for enclosing its cavity, a detector mixer unit comprising an oscillating signal generating diode connected between and positioned proximate to the first ends of the antenna elements for deriving radio frequency signals received by the antenna elements, signal input means for supplying an input signal providing an oscillating signal at the detector mixer unit for producing an output signal, and signal output means connected to the antenna elements at a location substantially displaced from the detector mixer unit for receiving the output signal, and in which the signal input and output means are provided by a signal conducting means for supplying the input signal and receiving the output signal having first and second conductors which extend into the cavity of the body and first and second signal terminating means respectively returning the second ends of the antenna elements to the conductive wall, the first conductor of the conducting means is connected with one of the second ends of the pair of windings and the second conductor is returned to the conductive wall of the body, and the conducting means delivers the input signal to the diode for causing the diode to generate an oscillating signal and for periodically quenching the oscillations in a superregenerative mode to provide a detected output signal.

25. The device of claim 24 in which the signal conducting mean is a coaxial transmission line having a center conductor which connects with the one of the second ends of the pair of windings of the antenna, and an outer conductor which is returned to the conductive wall of the body and the first and second signal terminating means comprise a pair of resistors respectively returning the second ends of the antenna elements to the conductive wall of the body.

26. The device of claim 25 in which the windings of the antenna and the detector mixer unit are on the external surface of the plate enclosing the cavity of the body, and the signal input and output means deliver a biasing signal to the diode of the detector mixer unit through the windings of the antenna for causing the diode to produce the oscillating signal and a quench signal for squenching the oscillations for providing the detected output signal.

27. The device of claim 26 which includes a voltage supply means for providing the biasing signal and a quench generator for providing a quench signal for delivery by the signal conducting means through the antenna elements to the oscillating signal generating diode, and in which the oscillating signal generating diode is a negative resistance diode.

28. The device of claim 27 in which a resonant cavity means is provided within the cavity of the body proximate to the detector mixer device, and a capacitor device which provides a controlled variable capacitance is received within the resonant cavity means for adjusting the frequency of the oscillating signal generated by the diode of the detector mixer unit.

* * * * *